United States Patent [19]

Boehnke et al.

[11] Patent Number: 5,030,872

[45] Date of Patent: Jul. 9, 1991

[54] ELECTRO-ACOUSTIC TRANSDUCER

[75] Inventors: Gerd Boehnke, Bottrop; Stefan Pieper, Haltern, both of Fed. Rep. of Germany

[73] Assignee: Siemens Aktiengesellschaft, Munich, Fed. Rep. of Germany

[21] Appl. No.: 388,994

[22] Filed: Aug. 3, 1989

[30] Foreign Application Priority Data

Aug. 10, 1988 [DE] Fed. Rep. of Germany ....... 3827165

[51] Int. Cl.[5] .............................................. H01L 41/08

[52] U.S. Cl. ...................................... 310/324; 310/345; 381/190

[58] Field of Search ......................... 310/348, 324, 345; 381/190

[56] References Cited

U.S. PATENT DOCUMENTS 3,708,702 1/1973 Brunnert et al. .
3,872,470 3/1975 Hoerz et al. .................... 310/324 X
4,295,009 10/1981 Weidler ........................... 310/324 X
4,302,695 11/1981 Boyles et al. ........................ 310/324
4,429,247 1/1984 Feldman ......................... 310/324 X
4,779,246 10/1988 Dietzsch et al. ................ 310/345 X

FOREIGN PATENT DOCUMENTS 1167897 7/1960 Fed. Rep. of Germany .
1961217 6/1971 Fed. Rep. of Germany .
3107293 9/1982 Fed. Rep. of Germany .

OTHER PUBLICATIONS

Martin et al., "Fernsprech-Piezomikrofon Ts71", 1972, pp. 207-209 Siemens-Zeitschrift.

*Primary Examiner*—Mark O. Budd
*Attorney, Agent, or Firm*—Hill, Van Santen, Steadman & Simpson

[57] ABSTRACT

An electro-acoustic transducer having a circular transducer plate arranged in a transducer housing, clamped between two mounting members at its edge region, is provided with a piezoelectric layer. At least one seating region of the mounting member is of a rotationally asymmetrical shape to attenuate partial oscillations of a higher order. The electro-acoustic transducer is usable as a transducer for telephones.

6 Claims, 2 Drawing Sheets

ELECTRO-ACOUSTIC TRANSDUCER

BACKGROUND OF THE INVENTION

1. Field of the Invention

The present invention is related generally to an electro-acoustic transducer in which a circular transducer plate is arranged in a transducer housing, clamped between bearing, or support, members at its edge region and is provided with a piezo-electric layer.

2. Description of the Related Art

During the manufacture of electro-acoustic transducers, one of the goals to be achieved is to exercised care that the relationship between the acoustic specification factors of the acoustic field and the electrical quantities of the transducer are largely frequency independent in the transmission range.

The frequency dependency of the relationship between the specification factors of the acoustic field and the electrical quantities of the transducer is particularly defined by the frequency dependency of the oscillatory, mechanical structure composed of the membrane and the coupled air chambers or the like.

The membranes of high-grade acoustic receivers of, for example, capacitor microphones, are clamped and arranged so that the resonant frequency corresponding to their fundamental oscillation lies above the frequency range of the interest, i.e. outside the range in which they are to be used. This is so that the relationship between the movement of the membrane and the specification factors of the. acoustic field is practically frequency independent in this frequency range.

In electro-acoustic transducers as used in the telephone industry, by contrast, it is usually not possible for reasons of efficiency to select the self-resonances of the membrane to lie outside the frequency range of interest. In order to nevertheless reduce the frequency dependency of the electro-acoustical transmission factor, it is standard practice to equip such transducers with correspondingly tuned resonators with whose assistance resonance peaks are compensated.

Instead of the usual membrane, recent piezo-electric transducers are formed of a transducer plate clamped at its edge region between two mounting members. The transducer plate is provided with a piezo-electric layer. When such plate is electrically or acoustically excited, then pronounced exaggerations, or distortions, are formed in the plate dependent on the measured acoustic pressure and on the frequency. Such distortions, which are distinguished by circular nodal lines and nodal diameters, may be made visible with holographic interferometry.

For cylindrically symmetrical transducer plates, the distortions distinguished by nodal diameters play no part. The circular nodal lines, however, are critical. Thus, the natural frequencies of a transducer having a circular transducer plate clamped at its edges between support members can, for example, be as follows:

Fundamental Resonance ($\sigma=0$, h=0)—approximately 1 to 1.5 kHz.

First Circular Nodal Line ($\sigma=1$, h=0)—about 4 kHz.

Second Circular Nodal Line ($\sigma=2$, h=0)—about 7 to 9 kHz.

Third Circular Nodal Line ($\sigma=3$, h=0)—about 14 kHz, whereby $\sigma$ denotes the number of circular nodal lines and h denotes the number of nodal diameters.

As already described, the resonant peaks must be attenuated so that tolerance ranges described by individual telephone administrations are not transgressed. For example, it is known to attenuate the fundamental resonance by about 15 dB with a Helmholtz resonator. (See, for example, Siemens Zeitschrift, Vol. 46, April 1972, No. 4, pages 207–209).

The partial oscillation characterized by the first circular nodal line can be attenuated by two half-wave resonators, as in German Patent No. 1,167,897.

The partial oscillation characterized by the second circular nodal line was previously not attenuated since it did not fall within the tolerance pattern prescribed by the telephone administrations. Due to the expansion of the tolerance ranges from 8 kHz to 10 kHz, however, this partial oscillation leads to a transgression of the tolerance range and so must be attenuated.

An attenuation of this partial oscillation can be carried out with a Helmholtz resonator having a broad-band effect that, however, is difficult to arrange in the existing transducer housing.

SUMMARY OF THE INVENTION

It is an object of the invention to implement the attenuation of the partial oscillation of a transducer plate characterized by two circular nodal lines with optimally simple means.

This and other objects and advantages of the invention are achieved in that at least one seating region of the bearing, or mounting, member for the transducer plate has a rotationally asymmetrical shape.

The transducer plate oscillating at one of its natural frequency can generate an acoustic pressure level that lies between pronounced exaggeration of the acoustic pressure and collapse of the acoustic pressure. The acoustic pressure that is established is result of the subsurfaces, or surface portions, of the transducer plate oscillating in anti-phase. These surface portions displace volumes that compensate to an effectively displaced volume. In a good approximation, the effectively displaced volume is proportional to the acoustic pressure. Of all natural frequencies, the fundamental resonance frequency produces the maximal acoustic pressure because no surface portions oscillate here in anti-phase. If one succeeds in making the volumes displaced in anti-phase of identical size for $\sigma \geqq 1$, then the acoustic pressure produced by the transducer plate disappears. The modification of the transducer plate mounting of the invention then succeeds in placing the volumes oscillating in anti-phase into the same order of magnitude. The partial modification of the edge clamping attenuates the natural frequency $\sigma=1$ and $\sigma=2$ by about 8 dB with only slight displacements of the natural frequencies to higher values. The fundamental resonance frequency remains relatively unaffected.

The invention also advantageously provides a way to avoid the use of involved resonators for attenuating partial oscillations. Depending upon the structural dimensions of the transducers, testing can be performed to determine how the rotationally asymmetrical shape of the mounting should be formed. It is, thus, expedient that both mounting members have a rotationally asymmetrical shape and/or be arranged relative to the transducer plate such that the seating regions lie opposite one another. It is also expedient that the mounting member be formed by a first concentric ring or annular shoulder that splits into to sub-rings in one sector.

The seating regions may be formed by pointed bearings. In other words, a peak may be provided running along the mounting face of the transducer plate support. It has also proven expedient for attenuating the partial oscillations when the seating regions of the mounting members are formed by planar surfaces. It is likewise expedient that the planar surfaces be of different sizes.

For manufacturing reasons, it is expedient that the mounting members be formed of one piece with the housing parts.

DETAILED DESCRIPTION OF THE PREFERRED EMBODIMENTS

Figure 1:
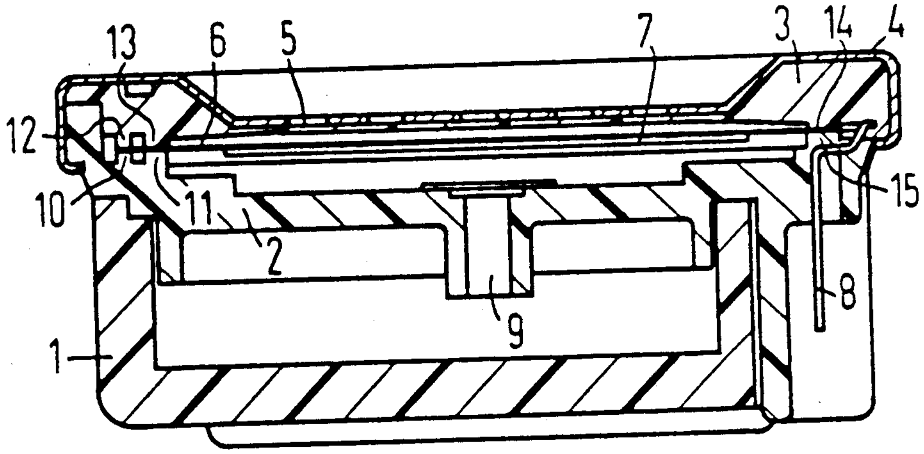
FIG. 1 is a cross section through an electro-acoustic transducer of the present invention.

A transducer is shown in FIG. 1 having a lower housing part 1 into which a carrier 2 is inserted. A resonator ring 3 is arranged over the carrier 2. The transducer housing is closed by a covering 4 which includes sound passages 5.

A transducer plate 6 that is provided with a piezo-electric layer 7 is arranged clamped between the carrier 2 and the resonator ring 3. The piezo-electric layer 7 has electrodes (not shown) that are connected to plugs 8, one of which is shown, via fillets or the like. A Helmholtz resonator 9 connects an antichamber of the carrier 2 to a post-chamber that serves the purpose of attenuating the fundamental resonance frequency.

The transducer plate 6 is rigidly clamped in its edge regions by bearing or mounting members that are composed of cylindrical annular projections 10 through 15 of the carrier 2 as well as of the resonator ring 3. The projection 10 on the carrier 2 is opposed by the projection 12 on the resonator ring 3. On the opposite side of the transducer is the projection 15 on the carrier 2 opposed by the projection 14 on the ring 3. The asymmetrical mounting of the transducer plate 6 is provided by the projection 11 and the projection 13 on the carrier 2 and ring 3, respectively.

Figure 2:
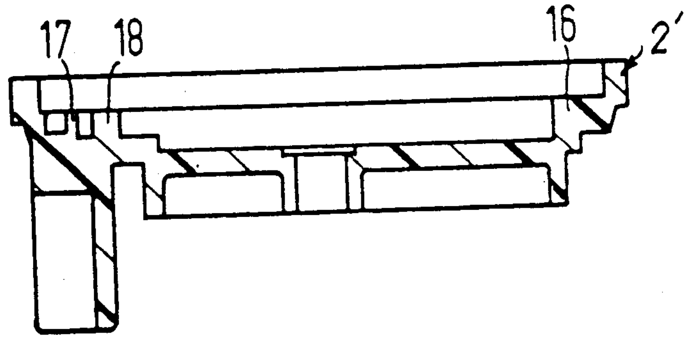
FIG. 2 is a cross section through a second embodiment of a carrier along line II—II of FIG. 3 for use in a transducer.
Figure 3:
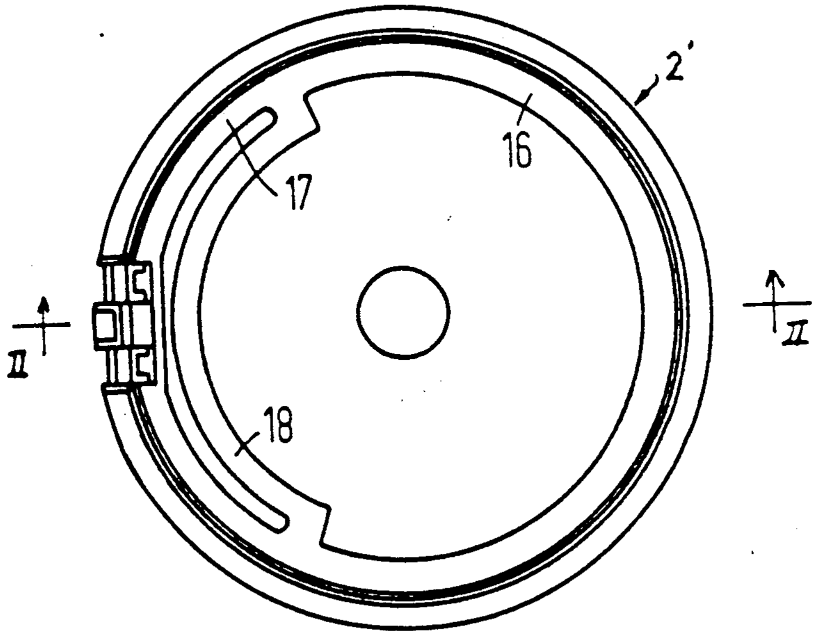
FIG. 3 is a plan view of the carrier of FIG. 2.

Since the projections 10 through 15 are difficult to recognize in FIG. 1, a second embodiment of a carrier 2' is shown separately in FIGS. 2 and 3. The carrier of FIGS. 2 and 3 has been turned by 180° in comparison to the illustration of FIG. 1. The seating regions for the transducer plate that are formed by annular cylindrical projections are now clearly visible. Thus, an annular projection 16 may be clearly seen, which is divided into two sub-rings 17 and 18 in a sector of the annular projections on the left-hand side of FIGS. 2 and 3. The seating region of the transducer plate thus comprises a rotationally asymmetrical shape. The projection 16 and sub-rings 17 and 18 have planar mounting surfaces against which the transducer plate is pressed by a like-shaped opposing mounting part, such as the ring 3 of FIG. 1. The seating region of the resonator ring is similarly fashioned, having planar mounting surfaces. The term resonator ring is selected because two half-wave resonators may be situated therein.

Figure 4:
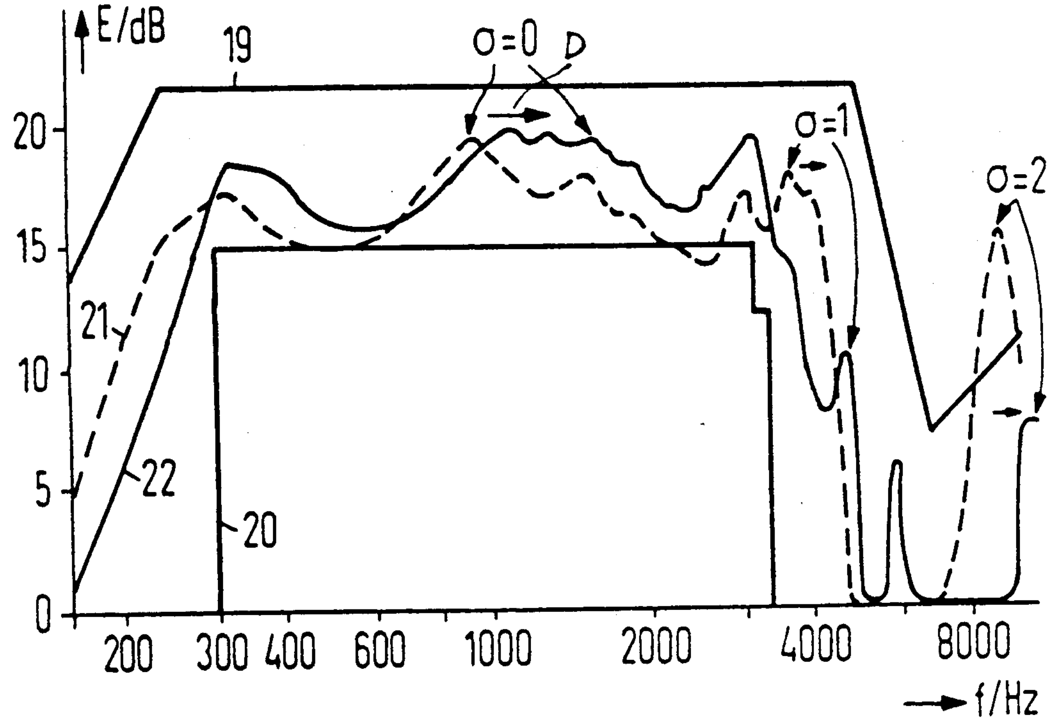
FIG. 4 is a graph showing the frequency response curve of the present transducer.

In FIG. 4 is shown a frequency response curve of the transducer. The ordinate denotes the sensitivity E in decibels (dB) and the abscissa denotes the frequency in Hz. Lines 19 and 20 bound the tolerance regions between which the frequency response curve should be situated. The tolerance regions are set, for example, by a telephone authority. Broken line 21 indicates a frequency response curve of the transducer given a rotationally symmetrical mounting, while solid line 22 denotes the frequency response curve given a mounting according to the present invention. It can be seen that the attenuated fundamental resonance $\sigma=0$ in the invention is displaced to somewhat higher frequencies, as shown by the horizontal arrow D. The resonance of the first partial oscillation $\sigma=1$ is likewise displaced to somewhat higher values and is attenuated. The partial oscillation $\sigma=2$ characterized by a second nodal circuit is significantly attenuated and likewise lies at somewhat higher frequencies.

It is clear after reviewing the graph of FIG. 4 that the frequency response curve of the transducer of the invention which has an asymmetrical mounting remains in the tolerance limits, while the symmetrical mounting of the transducer results in frequencies outside the limits.

Thus, there is shown and described an electro-acoustic transducer for attenuating partial oscillation to a higher order by providing at least one seating member of a mounting member of a rotationally asymmetrical shape for the transducer plate. Such transducer is particularly useful as a telephone transducer.

Although other modifications and changes may be suggested by those skilled in the art, it is the intention of the inventors to embody within the patent warranted hereon all changes and modifications as reasonably and properly come within the scope of their contribution to the art.

We claim:

1. An electro-acoustic transducer, comprising:

a transducer housing having mounting members, said mounting members including seating regions;

a circular transducer plate arranged in said transducer housing, edge regions of said transducer plate being clamped between said seating regions of said mounting members;

a pieze-electric member provided on said transducer plate;

at least one additional seating region of a rotational asymmetrical shape bearing against said transducer plate at a location radially inward of said seating regions of said mounting members to attenuate partial oscillations of circular resonances in said transducer plate.

2. An electro-acoustic transducer, comprising;

a transducer housing having mounting members;

a circular transducer plate arranged in said transducer housing, edge regions of said transducer plate being clamped between said mounting members;

a piezo-electric member provided on said transducer plate;

said mounting members having at least one seating region of a rotationally asymmetrical shape; and said transducer housing having two mounting members, both of which are of a rotationally asymmetrical shape and are arranged relative to said transducer plate at seating regions lying opposite one another.

3. An electro-acoustic transducer, comprising;

a transducer housing having mounting members;

a circular transducer plate arranged in said transducer housing, edge regions of said transducer plate being clamped between said mounting members;

a piezo-electric member provided on said transducer plate;

said mounting members having at least one seating region of a rotationally asymmetrical shape; and said at least one seating region being formed by a first annular projection that divides into two partial rings in one sector.

4. An electro-acoustic transducer as claimed in claim 1, wherein said at least one seating region of said mounting members is formed by planar surfaces.

5. An electro-acoustic transducer as claimed in claim 4, wherein said planar surfaces are of different sizes.

6. An electro-acoustic transducer as claimed in claim 1, wherein said mounting members are formed in one piece with parts of said transducer housing.

* * * * *